(12) United States Patent
Iba

(10) Patent No.: US 7,189,643 B2
(45) Date of Patent: Mar. 13, 2007

(54) SEMICONDUCTOR DEVICE AND METHOD OF FABRICATING THE SAME

(75) Inventor: Yoshihisa Iba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/784,821

(22) Filed: Feb. 24, 2004

(65) Prior Publication Data
US 2005/0017364 A1 Jan. 27, 2005

(30) Foreign Application Priority Data
Jul. 25, 2003 (JP) ............... 2003-280155

(51) Int. Cl.
*H01L 21/4763* (2006.01)
(52) U.S. Cl. ............... 438/638; 438/637; 438/798; 438/931; 257/E21.579
(58) Field of Classification Search ........ 438/637–640, 438/623, 783, 798
See application file for complete search history.

(56) References Cited
U.S. PATENT DOCUMENTS

| 6,720,255 | B1 | 4/2004 | Faust et al. | |
| 6,777,325 | B2 * | 8/2004 | Ryuzaki et al. | ............. 438/637 |
| 2002/0119677 | A1 | 8/2002 | Soda et al. | |
| 2002/0164872 | A1 * | 11/2002 | Han et al. | ................ 438/688 |
| 2003/0155657 | A1 * | 8/2003 | Tonegawa et al. | .......... 257/774 |
| 2003/0186537 | A1 * | 10/2003 | Yamanaka et al. | .......... 438/637 |
| 2006/0051968 | A1 * | 3/2006 | Joshi et al. | ................ 438/723 |

FOREIGN PATENT DOCUMENTS

| JP | 3250518 | 11/2001 |
| JP | 2002-026121 | 1/2002 |
| JP | 2002-261092 | 9/2002 |
| JP | 3365554 | 11/2002 |
| JP | 2003-124189 | 4/2003 |
| JP | 2004-193621 | 7/2004 |

* cited by examiner

*Primary Examiner*—Michael Lebentritt
*Assistant Examiner*—Cheung Lee
(74) *Attorney, Agent, or Firm*—Westerman, Hattori, Daniels & Adrian, LLP

(57) ABSTRACT

An SiC film, a porous silica film as an interlayer dielectric film, another SiC film, an $SiO_2$ film, an SiN film, and an antireflection film are formed in this order on an interlayer dielectric film and Cu film. The antireflection film is coated with an organic photosensitive ArF resist, and the resist is exposed and developed to form a resist mask in which a wiring trench pattern is formed. A trench is then formed in the porous silica film, the latter SiC film, the $SiO_2$ film, and the SiN film. Plasma processing using a hydrogen-containing gas is performed on the side surfaces of the porous silica film, thereby forming a modified layer. The exposed portion of the former SiC film is etched away to allow the trench to reach the Cu film.

18 Claims, 14 Drawing Sheets

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2003-280155, filed on Jul. 25, 2003, the entire contents of which are incorporated herein by reference.

BACKGROUND OF THE INVENTION

1. Field of the Invention

The present invention relates to a semiconductor device suited to the formation of a wiring layer, and a method of fabricating the semiconductor device.

2. Description of the Related Art

Recently, a method using a three-layered hard mask is used when a wiring layer is to be formed by using the damascene method. FIGS. 8A to 8D are sectional views showing a conventional semiconductor device fabrication method using the damascene method in order of steps.

In this conventional fabrication method, as shown in FIG. 8A, a Cu film 102 is buried in an interlayer dielectric film 101. On these films, an SiC film 103 as a barrier film, a porous silica film 104, an SiC film 105 as a cap film, an $SiO_2$ film 106, an SiN film 107, and an antireflection film 108 such as a BARC (Bottom Anti Reflection Coating) are formed in this order. In addition, a resist mask 109 made of an ArF resist is formed.

Subsequently, as shown in FIG. 8B, the resist mask 109 is used as a mask to etch the antireflection film 108 and SiN film 107. Then, the resist mask 109 and antireflection film 108 are removed by ashing. After that, the SiN film 107 is used as a mask to etch the $SiO_2$ film 106. The $SiO_2$ film 106 is then used as a mask to etch the SiC film 105 and remove the SiN film 107.

As shown in FIG. 8C, the $SiO_2$ film 106 is used as a mask to etch the porous silica film 104.

As shown in FIG. 8D, the $SiO_2$ film 106 is used as a mask to etch the SiC film 103. After that, an interconnection is formed.

Conventionally, Cu interconnections are formed by the damascene method as described above, and fine low-resistance interconnections are obtained.

Unfortunately, in the above-mentioned damascene method, as shown in FIG. 8D, when the SiC film 103 as a barrier film is etched, the porous silica film 104 as a low-dielectric-constant film is processed by side etching. Consequently, the side portions of the porous silica film 104 recede. This phenomenon appears not only for a porous silica film but also for other inorganic low-dielectric-constant films, e.g., an SiOC film, SiOCN film, porous SiOC film, and porous SiOCN film.

Prior Arts are disclosed in Patent reference 1 (Japanese Patent Application Laid-Open No. 2003-124189), Patent reference 2 (Japanese Patent No. 3250518), Patent reference 3 (Japanese Patent No. 3365554), and Patent reference 4 (Japanese Patent Application Laid-Open No. 2002-26121).

SUMMARY OF THE INVENTION

It is an object of the present invention to provide a semiconductor device by which desired characteristics can be obtained by preventing side etching of an interlayer dielectric film when a trench (wiring trench) is formed, and a method of fabricating the semiconductor device.

The present inventor made extensive studies to achieve the above object, and has reached the aspects of the invention described below.

In a first semiconductor device fabrication method according to the present invention, an SiC barrier film is formed over an interconnection, and an interlayer dielectric film containing Si, C, and O is formed over this SiC barrier film. A hole reaching the SiC barrier film is then formed in the interlayer dielectric film, and plasma processing using a hydrogen-containing gas is performed on the side surfaces of the interlayer dielectric film. The side surfaces are exposed to the hole. The SiC barrier film is etched to allow the hole to reach the interconnection. A conductive material is buried in the hole.

In a second semiconductor device fabrication method according to the present invention, an SiC barrier film is formed over an interconnection, and an interlayer dielectric film containing Si, C, and O is formed over this SiC barrier film. A hole reaching the SiC barrier film is then formed in the interlayer dielectric film, and plasma processing is performed on the side surfaces of the interlayer dielectric film. The side surfaces are exposed to the hole. Thereby an organic film is formed on the side surfaces of the interlayer dielectric film. The SiC barrier film is etched to allow the hole to reach the interconnection. A conductive material is buried in the hole.

DETAILED DESCRIPTION OF THE PREFERRED EMBODIMENTS

Embodiments of the present invention will be described in detail below with reference to the accompanying drawings. For the sake of convenience, the structure of each semiconductor device will be explained together with its fabrication method.

(First Embodiment)

The first embodiment of the present invention will be described below. FIGS. 1A to 1J are sectional views showing a method of fabricating a semiconductor device according to the first embodiment of the present invention in order of steps. In this embodiment, a semiconductor device is fabricated by using the single damascene method.

Figure 1A:
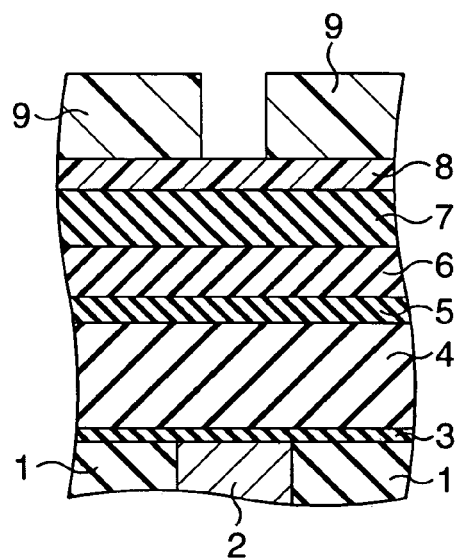
FIGS. 1A to 1J are sectional views showing a method of fabricating a semiconductor device according to the first embodiment of the present invention in order of steps.

First, an element such as a transistor is formed on the surface of a semiconductor substrate (not shown). After that, an interlayer dielectric film (not shown) is formed on the element, and a contact plug is formed in this interlayer dielectric film. In addition, an interlayer dielectric film 1 is formed on this interlayer dielectric film, as shown in FIG. 1A. A Cu film 2 (a conductive layer such as an interconnection or via plug) is buried in the interlayer dielectric film 1, and an SiC film 3 is formed as an etching stopper film (barrier film) on the interlayer dielectric film 1 and Cu film 2. The thickness of the SiC film 3 is, e.g., 30 nm. A porous silica film 4 is then formed as an interlayer dielectric film on the SiC film 3. The thickness of the porous silica film 4 is, e.g., 200 nm. The porous silica film 4 is a porous low-dielectric-constant insulating film.

An SiC film 5 is formed as a cap film (first hard mask) on the porous silica film 4, and an $SiO_2$ film 6 is formed as a second hard mask. The thicknesses of the SiC film 5 and $Sio_2$ film 6 are 30 and 150 nm, respectively. Subsequently, an SiN film 7 is formed as a third hard mask on the $SiO_2$ film 6. The thickness of the SiN film 7 is, e.g., 70 nm. After that, an antireflection film 8 necessary for patterning is formed on the SiN film 7. The antireflection film 8 is, e.g., an organic BARC. The antireflection film 8 is then coated with an organic photosensitive ArF resist, and the resist is exposed and developed to form a resist mask 9 in which a wiring trench pattern is formed. The width of a wiring trench is, e.g., about 100 nm. The thicknesses of the antireflection film 8 and resist mask 9 are, e.g., 80 and 300 nm, respectively.

Figure 1B:
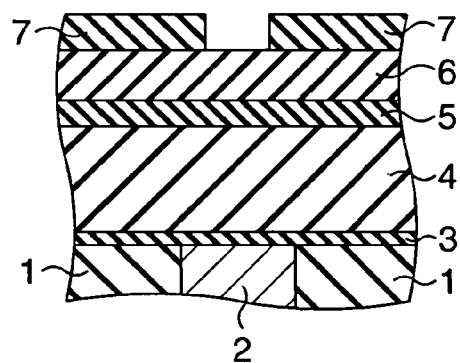

As shown in FIG. 1B, the resist mask 9 is used as a mask to etch the antireflection film 8 and SiN film 7. Then, the resist mask 9 and antireflection film 8 are removed by oxygen ashing. Since the porous silica film 4 is covered with the $SiO_2$ film 6 and SiC film 5, the porous silica film 4 is not exposed to the oxygen plasma during ashing.

Figure 1C:
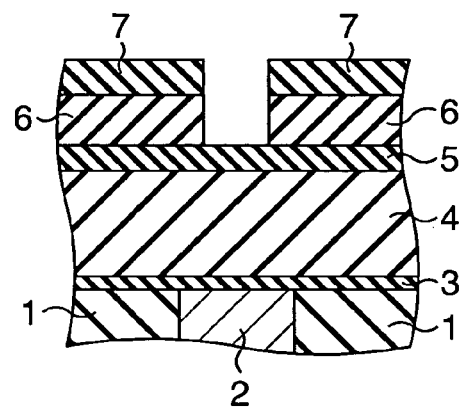
Figure 1D:
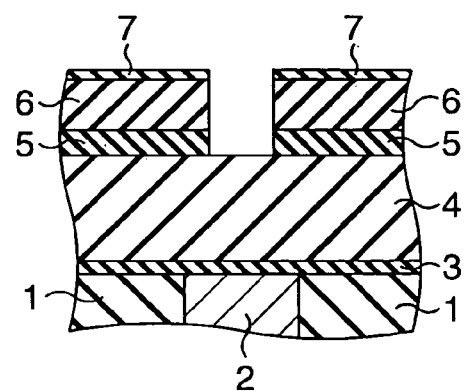

After that, as shown in FIG. 1C, the SiN film 7 is used as a mask to etch the $SiO_2$ film 6. Subsequently, as shown in FIG. 1D, the SiN film 7 is used as a mask to etch the SiC film 5. During this etching, the thickness of the SiN film 7 reduces. The SiN film 7 may also disappear by this etching.

Figure 1E:
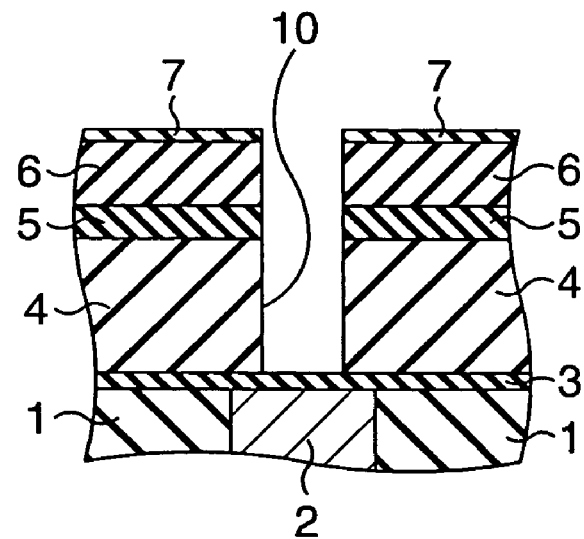

As shown in FIG. 1E, the $SiO_2$ film 6 is used as a mask to etch the porous silica film 4. This etching is performed using no oxygen. For example, this etching is performed by using a plasma etching apparatus at a pressure of 13.3 Pa (100 mTorr) and an RF power of 500 W by supplying $CF_4$, $CHF_3$, and $N_2$ at 100, 100, and 20 sccm, respectively, into the processing chamber. By this etching, a trench (wiring trench) 10 is formed in the porous silica film 4.

Figure 1F:
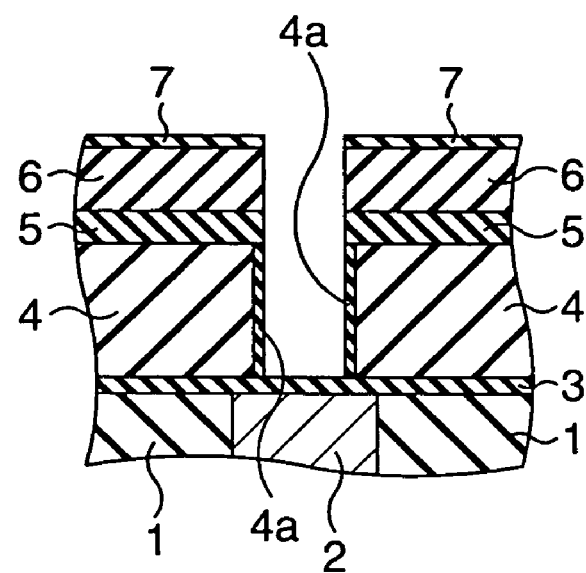

As shown in FIG. 1F, hydrogen plasma processing is then performed to form a modified layer 4a by modifying the exposed portions of the porous silica film 4. For example, this hydrogen plasma processing is performed by using a plasma etching apparatus at a pressure of 13.3 Pa (100 mTorr) and an RF power of 200 W by supplying $H_2$ and $N_2$ at 200 and 100 sccm, respectively, into the processing chamber. The processing time is set to, e.g., 10 sec by which the thickness of the modified layer 4a decreases to 10 nm or less. This hydrogen plasma processing increases the selectivity between the porous silicon film 4 including the modified film 4a and the SiC film 3. In the porous silica film 4, the Si and C concentrations in the modified layer 4a are higher than those in the other portion. Note that the concentration of only one of Si and C in the modified layer 4a may also be higher than that in the other portion.

Figure 1G:
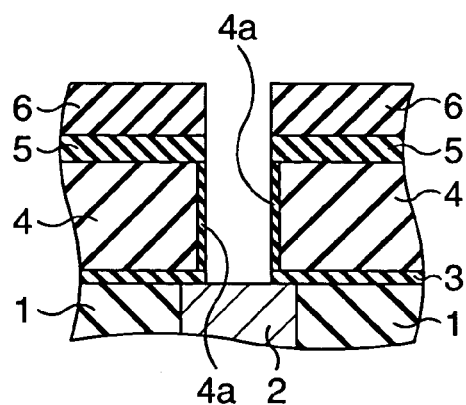

As shown FIG. 1G, the $SiO_2$ film 6 is used as a mask to etch away the exposed portion of the SiC film 3 and the SiC film 7. This etching is performed using nitrogen without using any oxygen. For example, this etching is performed by using a plasma etching apparatus at a pressure of 3.99 Pa (30 mTorr) and an RF power of 200 W by supplying $CF_4$, $CH_2F_2$, and $N_2$ at 20, 20, and 50 sccm, respectively, into the processing chamber. By this etching, the trench 10 reaches the underlying Cu film 2. Subsequently, wet cleaning is performed on the entire surface.

Figure 1H:
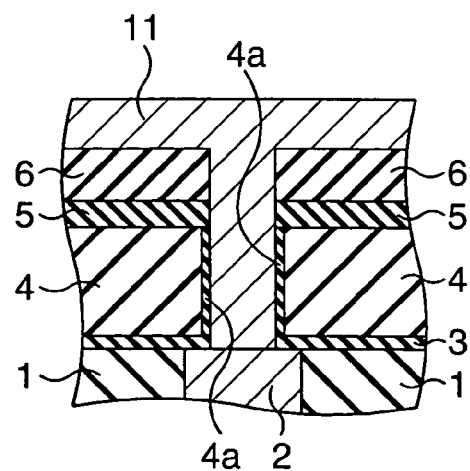
Figure 1I:
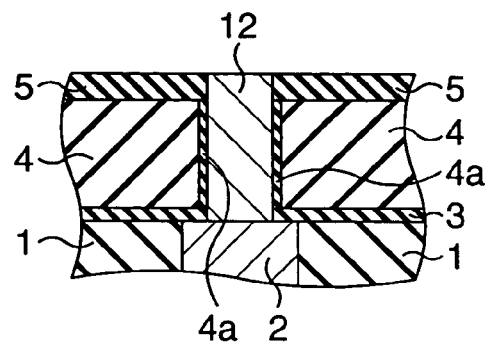
Figure 1J:
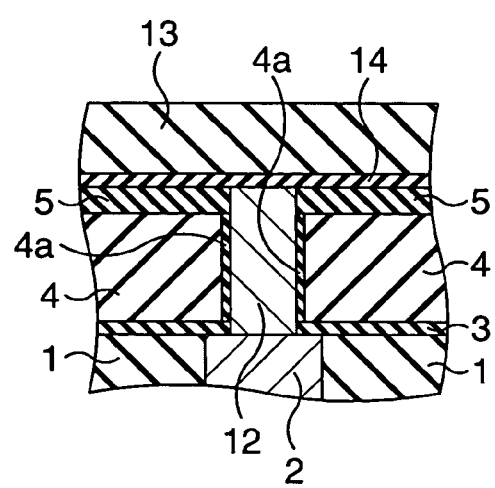

A barrier metal film and Cu seed film (neither is shown) are then formed on the bottom portion and side portions of the trench 10. As shown in FIG. 1H, a Cu film (wiring material) 11 is buried in the trench 10 by plating. As shown in FIG. 1I, the Cu film 11 is polished by CMP (Chemical Mechanical Polishing) until the SiC film 5 is exposed, thereby forming an interconnection 12. After that, as shown in FIG. 1J, an SiC film 14 as a barrier film and an interlayer dielectric film 13 are formed, and an upper interconnection and the like are also formed to complete a semiconductor device.

In the first embodiment as described above, when the SiC film 3 as a barrier film is etched, the modified layer 4a is formed on the side portions of the porous silica film 4, so the porous silica film 4 does not recede by side etching. As a consequence, the designed structure and characteristics can be obtained.

(Second Embodiment)

Figure 2A:
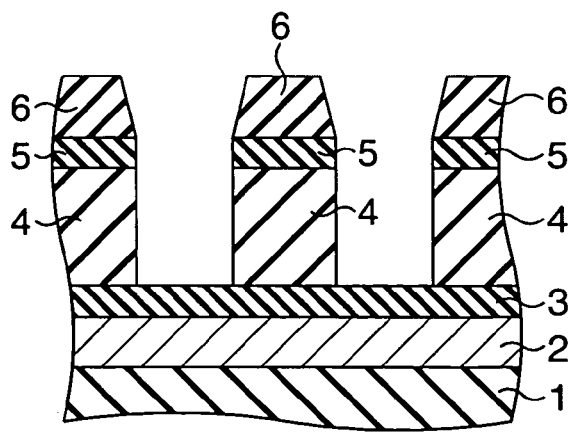
FIGS. 2A to 2C are sectional views showing a method of fabricating a semiconductor device according to the second embodiment of the present invention in order of steps.
Figure 2B:
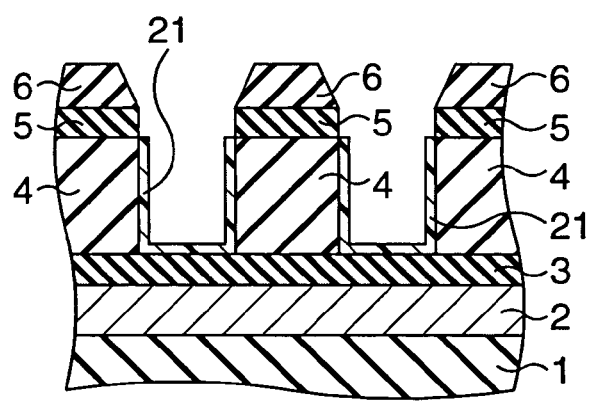
Figure 2C:
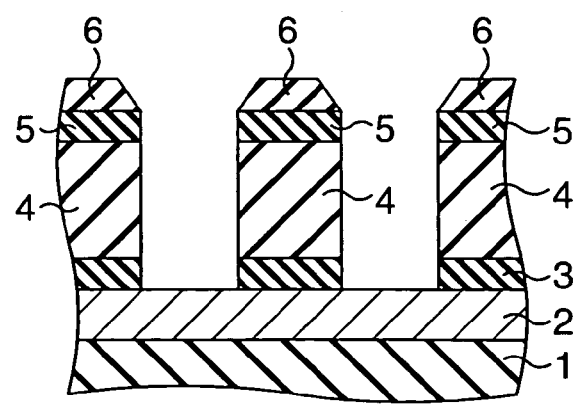

The second embodiment of the present invention will be described below. FIGS. 2A to 2C are sectional views showing a method of fabricating a semiconductor device according to the second embodiment of the present invention in order of steps. In the first embodiment, the modified portion 4a prevents side etching of the porous silica film 4. However, the presence of the modified portion 4a may increase the dielectric constant. The second embodiment is made in consideration of this problem. In the second embodiment, therefore, a film for protecting a porous silica film 4 is formed instead of the modified portion 4a.

In this embodiment, as shown in FIG. 2A, processing up to etching of the porous silica film 4 is performed in the same manner as in the first embodiment. In this embodiment, however, an SiN film 7 disappears at this point as shown in FIG. 2A. Since the SiN film 7 is not used in the subsequent steps, it may also disappear in the first embodiment and remain in the second embodiment.

As shown in FIG. 2B, a polymer deposition film (organic film) 21 is formed on the side surfaces of the porous silica film 4. The polymer deposition film 21 may also be simultaneously formed on an SiC film 3. The formation conditions of the polymer deposition film 21 will be explained later.

As shown in FIG. 2C, an $SiO_2$ film 6 is used as a mask to etch away exposed portions of the SiC film 3. By this etching, the polymer deposition film 21 almost disappears. After that, wet cleaning is performed on the entire surface. As a consequence, the polymer deposition film 21 is completely removed even if it remains before this step.

A Cu film 11, other films and the like are formed in the same manner as in the first embodiment, thereby completing a semiconductor device.

In the second embodiment as described above, no modified portion 4a is formed on the side portions of the porous silica film 4, and the polymer deposition film 21 is completely removed before interconnections are formed. Accordingly, the designed structure and characteristics can be obtained more reliably.

Figure 3:
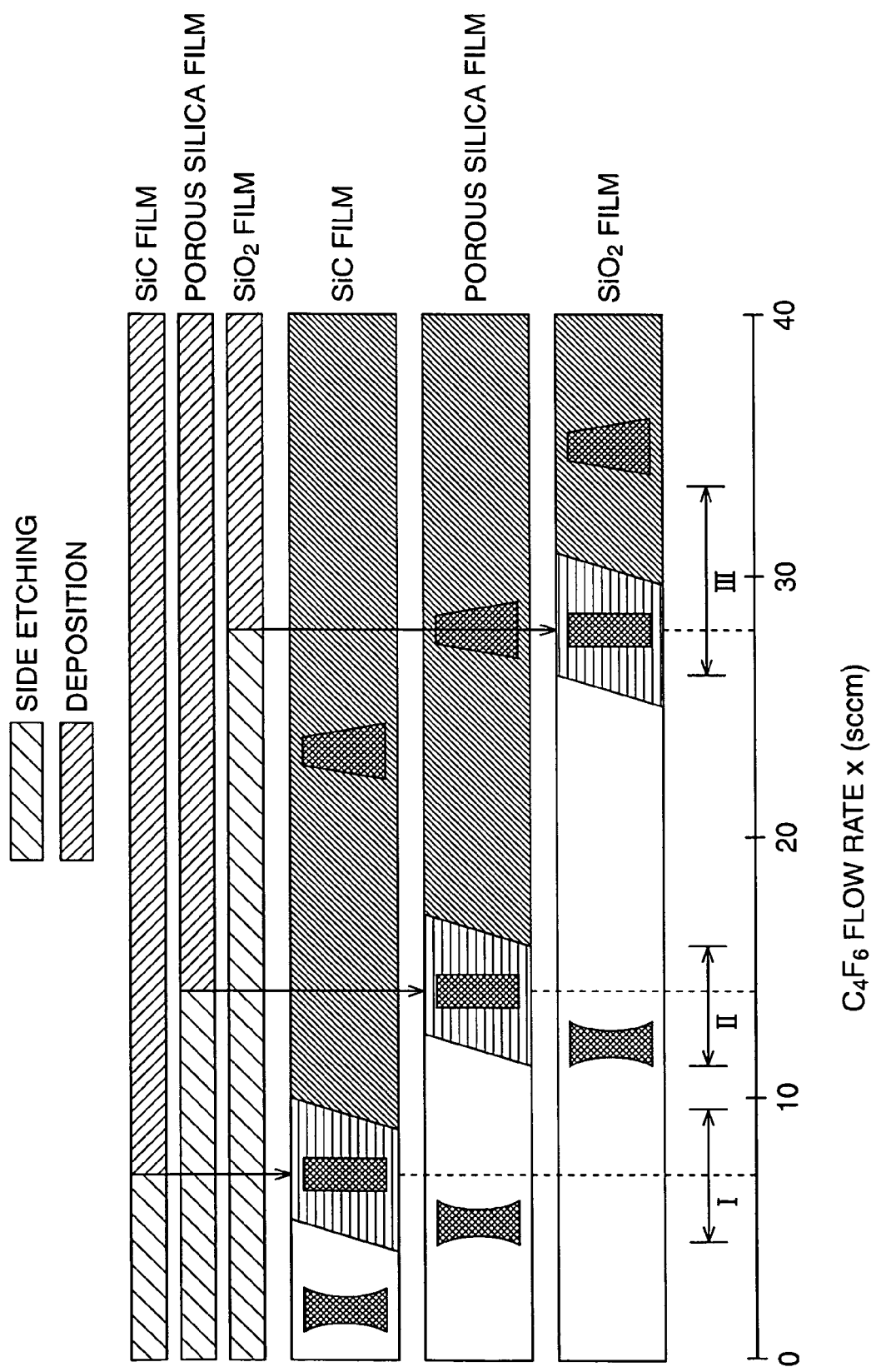
FIG. 3 is a view showing the relationships between the conditions of plasma processing and the shapes of the processed films.
Figure 4:
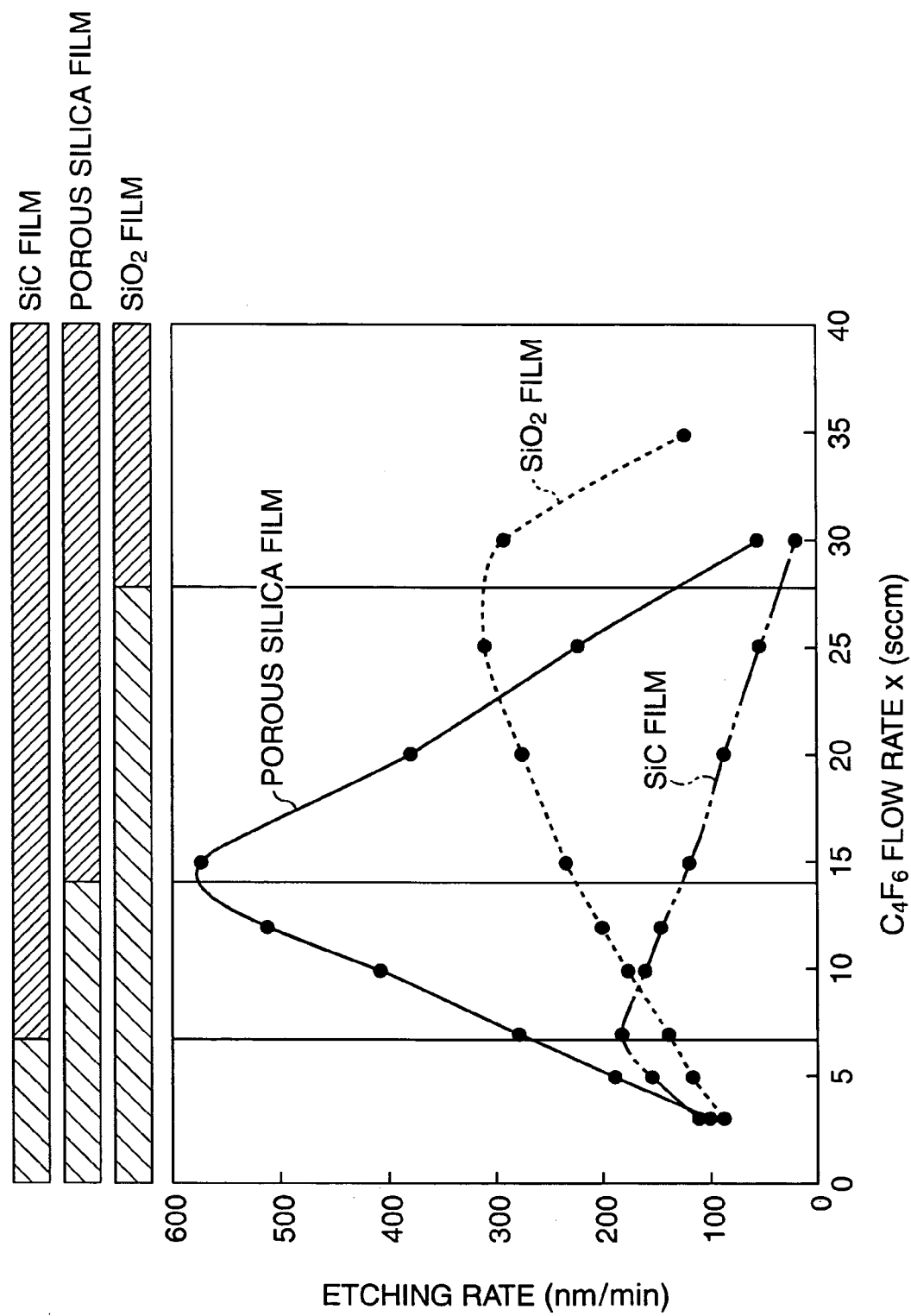
FIG. 4 is a graph showing the relationships between the conditions of plasma processing and the processed states of the processed films.

The formation conditions of the polymer deposition film 21 will be described below. FIG. 3 is a view showing the relationships between the plasma processing conditions and the shapes of the processed films. FIG. 4 is a graph showing the relationships between the plasma processing conditions and the processed states of the processed films. FIGS. 3 and 4 are obtained by changing the value of x when the plasma processing conditions are such that $C_4F_6$, $O_2$, and Ar are supplied at x, 20, and (400−20−x) sccm, respectively, into the processing chamber, the pressure is 13.3 Pa (100 mTorr), and the RF power is 1,000 W.

As shown in FIG. 3, the shape of any of the SiC film, porous silica film, and $SiO_2$ film after the processing changes in accordance with the value of x. More specifically, the smaller the x value, the more easily the film is bowed (the side surfaces recede in the form of a bow) by side etching; the larger the x value, the more easily the porous deposited product deposits. Substantially vertical side surfaces are obtained under intermediate conditions. Also, $C_4F_6$ flow rate ranges (x ranges) I, II, and III in which the side surfaces of the SiC film are substantially vertical, the side surfaces of the porous silica film are substantially vertical, and the side surfaces of the $SiO_2$ film are substantially vertical, respectively, increase in value in this order. Since the purpose of the present invention is to prevent side etching of the porous silica film, the $C_4F_6$ flow rate must fall within the flow rate range II or larger. In addition, deposition of the polymer deposition product of the $SiO_2$ film is preferably avoided as much as possible. This is so because if this deposition occurs, the interior of the chamber and the semiconductor device itself may be contaminated. Therefore, the $C_4F_6$ flow rate preferably falls within the flow rate range III or smaller. In the second embodiment, the plasma processing conditions are such that $C_4F_6$, $O_2$, and Ar are supplied at 30, 20, and 350 sccm, respectively, into the processing chamber, the pressure is 13.3 Pa (100 mTorr), the RF power is 1,000 W, and the processing time is 4 sec.

As shown in FIG. 4, which of side etching or deposition of the polymer deposition product occurs substantially depends upon the conditions under which the etching rate is a maximum. Note that FIG. 4 shows not relationships obtained for the structure as shown in FIGS. 2A to 2C, but relationships obtained when an SiC film, porous silica film, and $SiO_2$ film are individually formed on substrates and subjected to plasma processing under the conditions as described above. Generally, when the deposition rate of the polymer deposition product is higher than the etching rate shown in FIG. 4, deposition of the polymer deposition product progresses to form a polymer deposition film. If the deposition rate of the polymer deposition product is lower than the etching rate, etching of the processed film progresses.

Figure 5A:
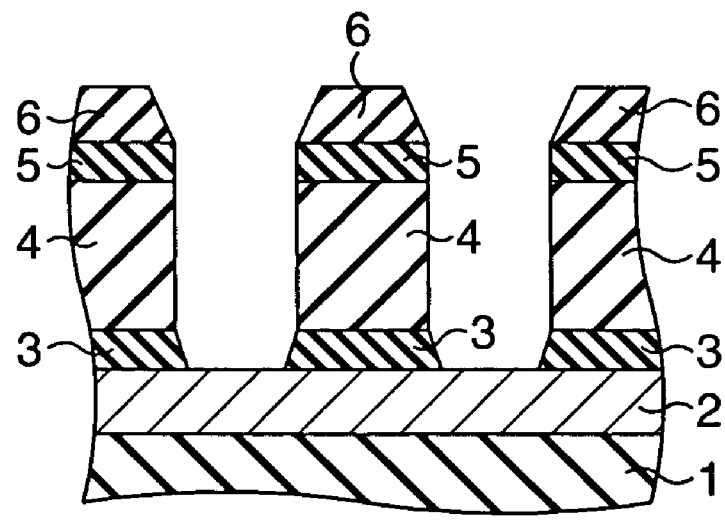
FIGS. 5A and 5B are sectional views showing a tapered SiC film 3 and a bowed porous silica film 4, respectively.
Figure 5B:
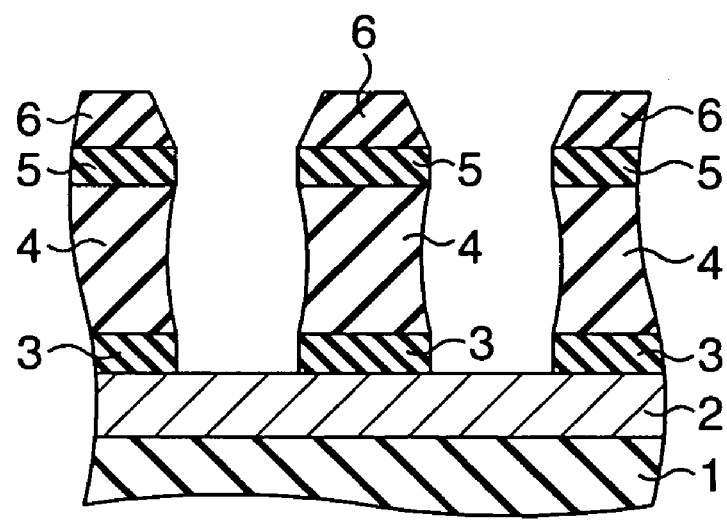
Figure 8A:
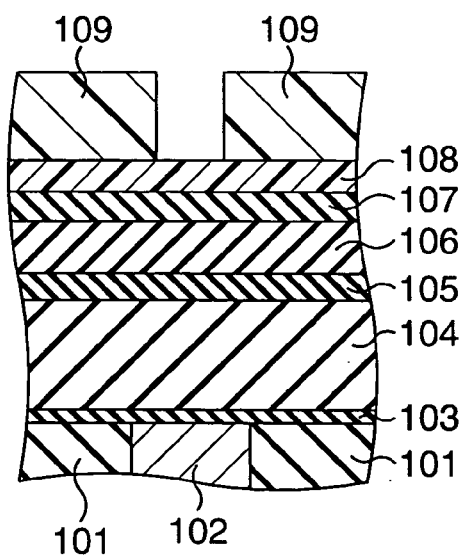
FIGS. 8A to 8D are sectional views showing a conventional semiconductor device fabrication method using the damascene method in order of steps.
Figure 8B:
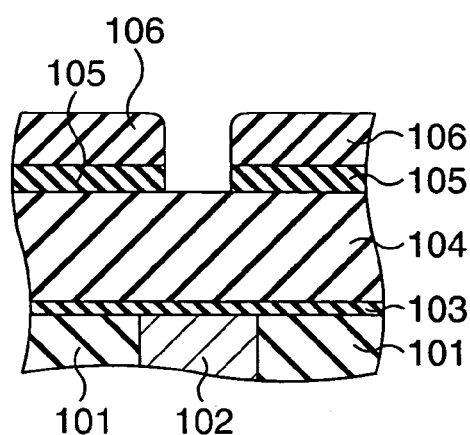
Figure 8C:
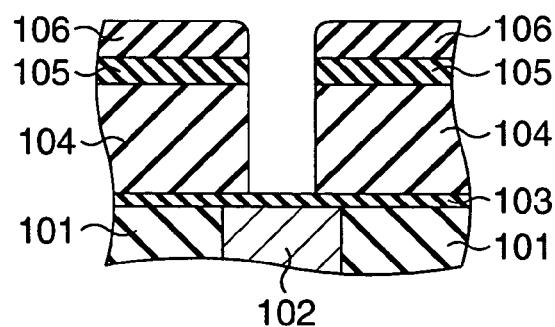
Figure 8D:
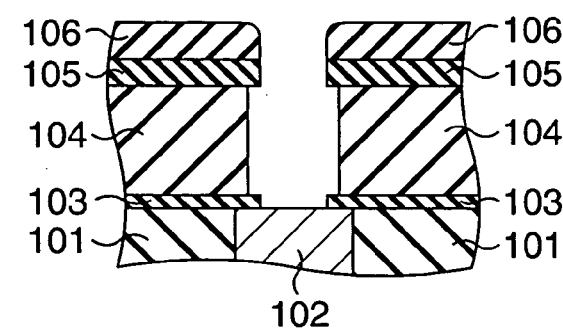

For example, after the $SiO_2$ film 6 is etched in the second embodiment, if the porous silica film 4 is etched under the conditions of the flow rate range II and the SiC film 3 is etched under the conditions of the same flow rate range II, the SiC film 3 is tapered as shown in FIG. 5A. Likewise, after the $SiO_2$ film 6 is etched in the second embodiment, if the porous silica film 4 is etched under the conditions of the flow rate range II and the SiC film 3 is etched under the conditions of the flow rate range I, the porous silica film 4 is bowed as shown in FIG. 5B. This state shown in FIG. 5B is equivalent to the state shown in FIG. 8D.

(Third Embodiment)

Figure 6A:
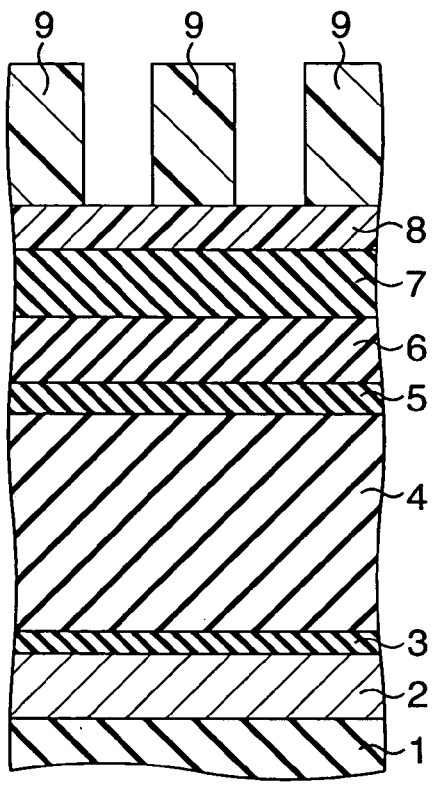
FIGS. 6A to 6Q are sectional views showing a method of fabricating a semiconductor device according to the third embodiment of the present invention.

The third embodiment of the present invention will be described below. FIGS. 6A to 6Q are sectional views showing a method of fabricating a semiconductor device according to the third embodiment of the present invention. In this embodiment, a semiconductor device is fabricated by the dual damascene method of a trench pre-exposure type.

First, as shown in FIG. 6A, an SiC film 3 as an etching stopper is formed on a Cu film 2 (conductive layer) formed in an interlayer dielectric film 1. A porous silica film 4 as an interlayer dielectric film is formed on the SiC film 3. On the porous silica film 4, an SiC film 5 is formed as a cap film (first hard mask), and an $SiO_2$ film 6 is formed as a second hard mask. Subsequently, an SiN film 7 is formed as a third hard mask on the $SiO_2$ film 6. After that, an antireflection film 8 necessary for patterning is formed on the SiN film 7. The antireflection film 8 is, e.g., an organic BARC. The antireflection film 8 is coated with an organic photosensitive ArF resist, and this resist is exposed and developed to form a resist mask 9 in which a wiring trench pattern is formed.

Figure 6B:
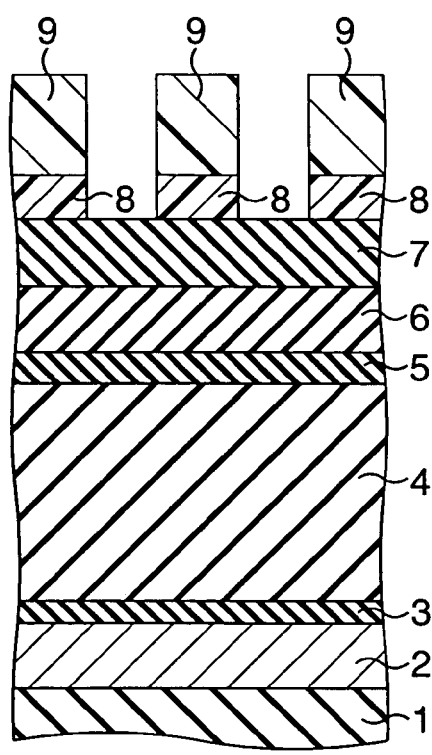

As shown in FIG. 6B, the resist mask 9 is used as a mask to etch the antireflection film 8.

Figure 6C:
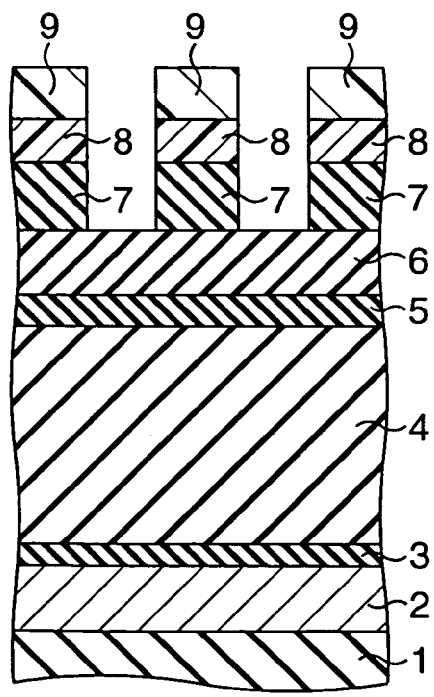

As shown in FIG. 6C, the resist mask 9 is used as a mask to etch the SiN film 7. As a consequence, the SiN film 7 is patterned into the wiring trench pattern.

Figure 6D:
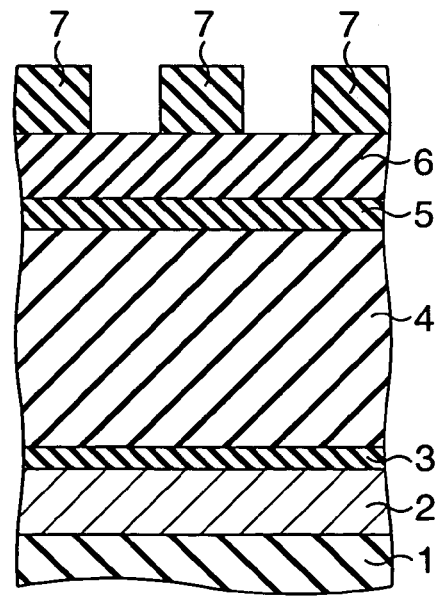

After that, as shown in FIG. 6D, the resist mask 9 and antireflection film 8 are removed by ashing.

Figure 6E:
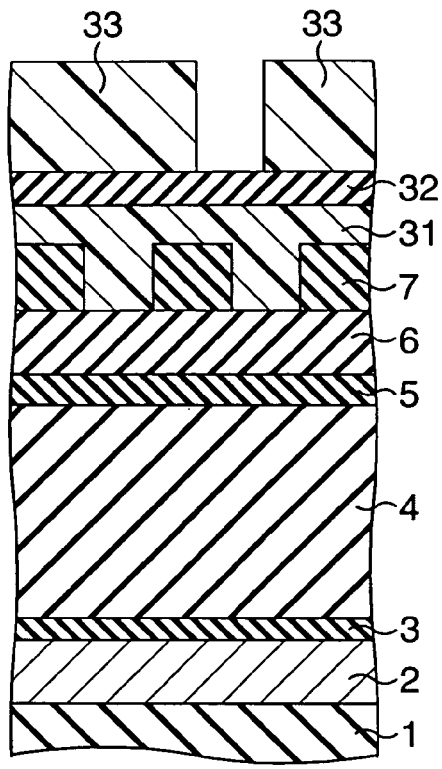

Subsequently, as shown in FIG. 6E, a lower resin film (organic film) 31 for planarization is formed to fill the steps of the SiN film 7. On the lower resin film 31, an SOG (Spin On Glass) film (inorganic film) 32 to be used as a mask when the lower resin film 31 is to be etched is formed. The SOG film 32 is then coated with an organic photosensitive resin, and this resin is exposed and developed to form a resist mask (photosensitive resist film) 33 in which a via hole pattern is formed.

As the photosensitive resist, it is possible to use, e.g., a material sensitive to a KrF laser (wavelength: 248 nm), a material sensitive to an ArF laser (wavelength: 193 nm), a material sensitive to an $F_2$ laser (wavelength: 157 nm), or a material sensitive to an electron beam.

As the material of the SOG film 32, an SOG material such as organic silicate glass or an organic siloxane polymer can be used. An example of the material of the lower resin film 31 is a coating type organic resin material.

Figure 6F:
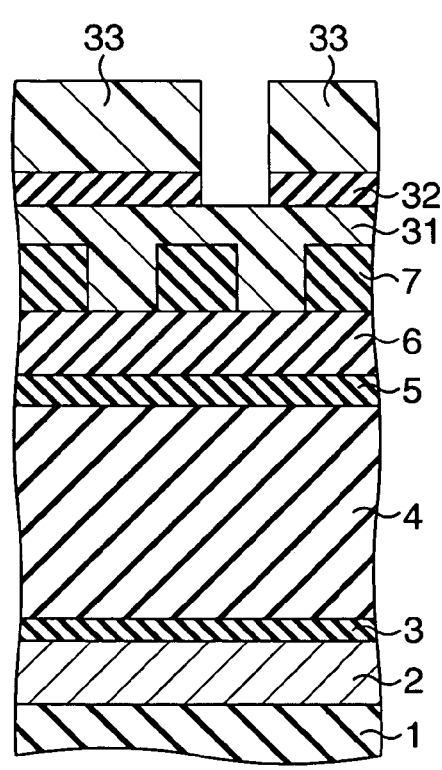

After that, as shown in FIG. 6F, the resist mask 33 is used as a mask to etch the SOG film 32.

Figure 6G:
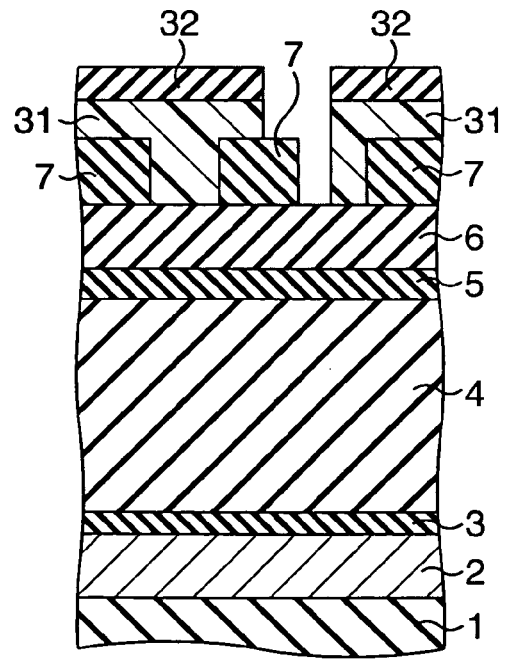

Subsequently, as shown in FIG. 6G, the SOG film 32 is used as a mask to etch the lower resin film 31 and at the same time remove the resist mask 33. In this etching, the etching selectivity to the lower resin film 31 and resist mask 33 is at most about 1 because the lower resin film 31 is made of an organic material similar to that of the resist mask 33. Therefore, if the film thickness of the resist mask 33 is much larger than that of the lower resin film 31, the resist mask 33 may remain on the SOG film 32 even after etching of the lower resin film 31 is complete. For this reason, the film thickness of the resist mask 33 is desirably equal to or smaller than that of the lower resin film 31.

Figure 6H:
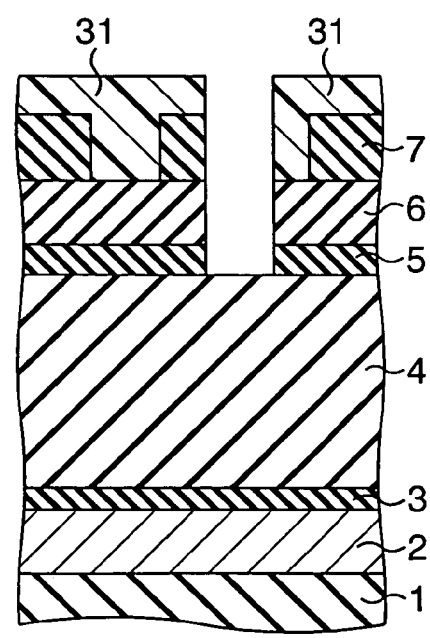

As shown in FIG. 6H, the lower resin film 31 is used as a mask to etch the SiN film 7 and $SiO_2$ film 6, thereby forming a via hole pattern in these films and removing the SOG film 32.

Figure 6I:
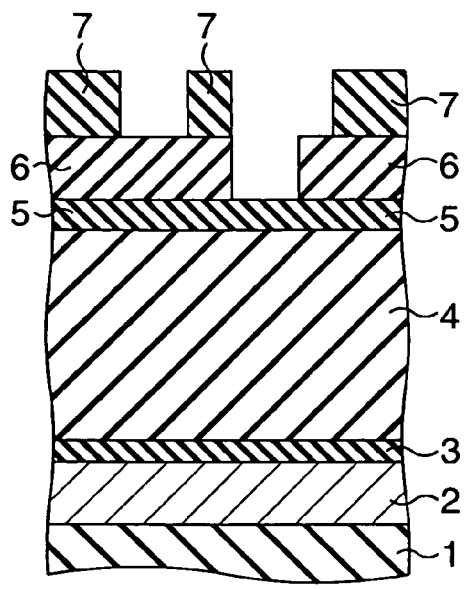
Figure 6J:
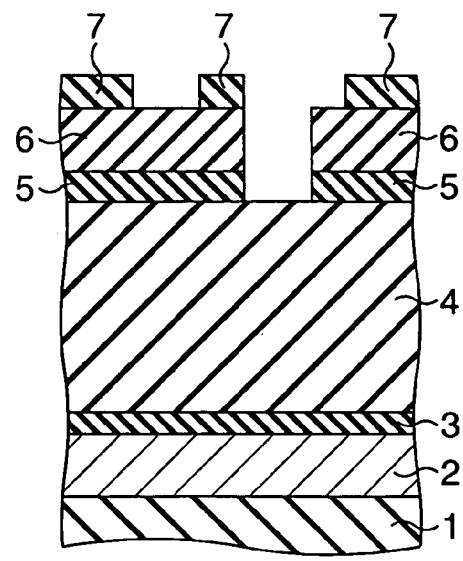
Figure 6K:
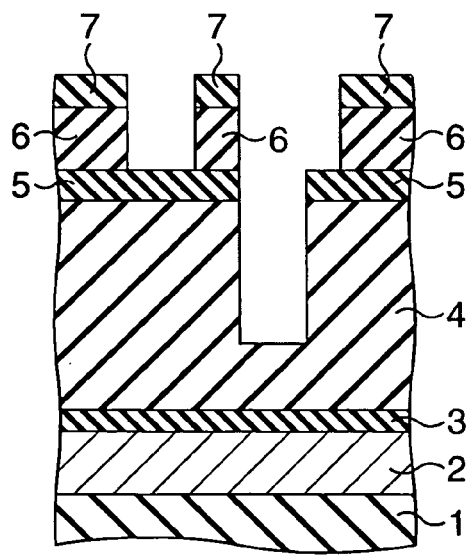
Figure 6L:
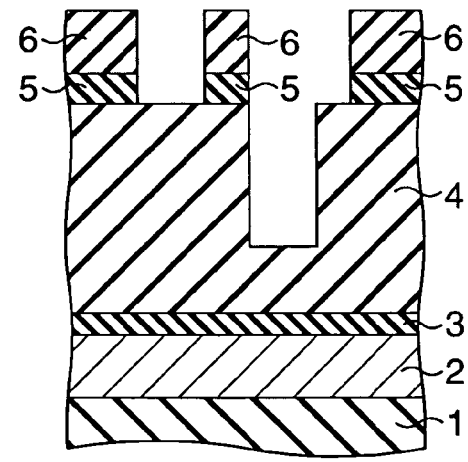

As shown in FIG. 6I, the lower resin film 31 is removed by ashing. After that, as shown in FIG. 6J, the $SiO_2$ film 6 is used as a mask to etch the SiC film 5. In this step, the SiN film 7 is also etched to reduce its thickness. Subsequently, as shown in FIG. 6K, the SiN film 7 and SiC film 5 are used as masks to etch the $SiO_2$ film 6 and porous silica film 4. Etching of the porous silica film 4 is stopped in its middle portion in the direction of thickness. As a consequence, the wiring trench pattern is also formed in the $SiO_2$ film 6. In addition, a hole formed in the porous silica film 4 by this etching functions as part of the via hole. As shown in FIG. 6L, the $SiO_2$ film 6 is used as a mask to etch away the exposed portions of the SiC film 5 and the SiN film 7. Consequently, the wiring trench pattern is formed in the SiC film 5.

Figure 6M:
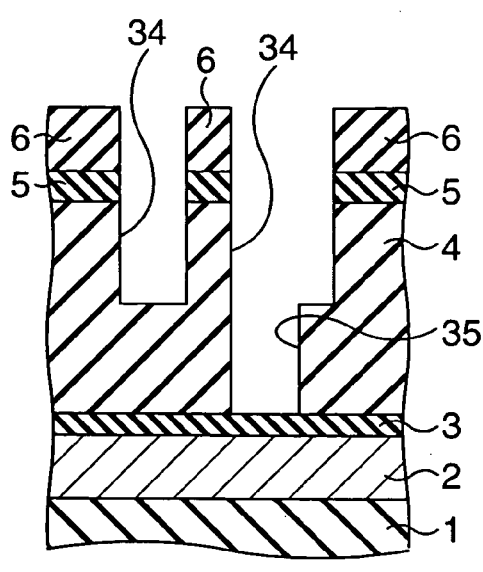

The $SiO_2$ film 6 and SiC film 5 are then used as masks to etch the porous silica film 4, which is an interlayer dielectric film. Consequently, as shown in FIG. 6M, wiring trenches 34 and a via hole 35 reaching the SiC film 3 are formed at the same time.

Figure 6N:
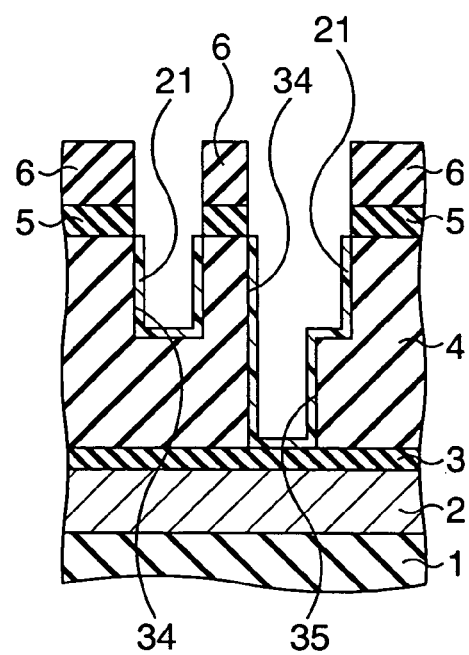

After that, as shown in FIG. 6N, a polymer deposition film 21 is formed on the side surfaces of the porous silica film 4 in the same manner as in the second embodiment. The polymer deposition film 21 may also be formed on the SiC film 3. The formation conditions of the polymer deposition film 21 are the same as described previously.

Figure 6O:
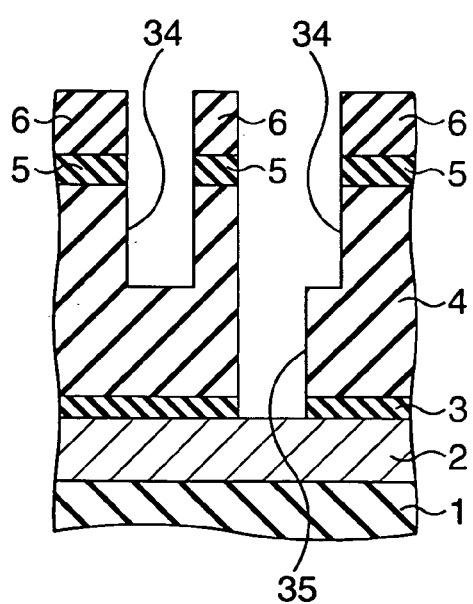

Subsequently, as shown in FIG. 6O, the $SiO_2$ film 6 is used as a mask to etch away the exposed portion of the SiC film 3, thereby allowing the via hole 35 to reach the Cu film 2. By this etching, the polymer deposition film 21 almost disappears. After that, wet cleaning is performed on the entire surface. As a consequence, the polymer deposition film 21 is completely removed even if it remains before this step.

Figure 6P:
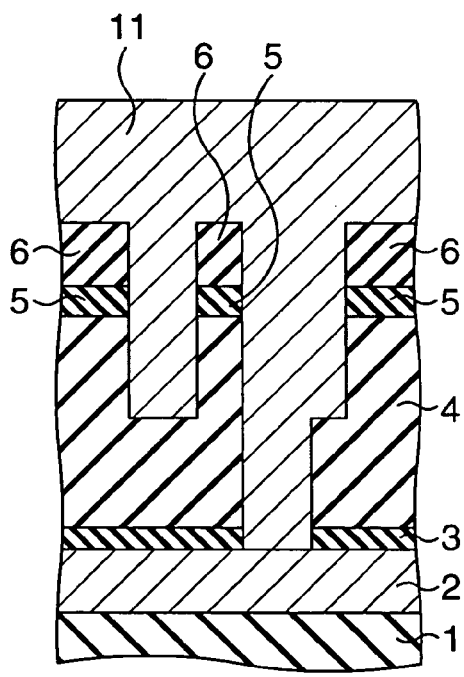
Figure 6Q:
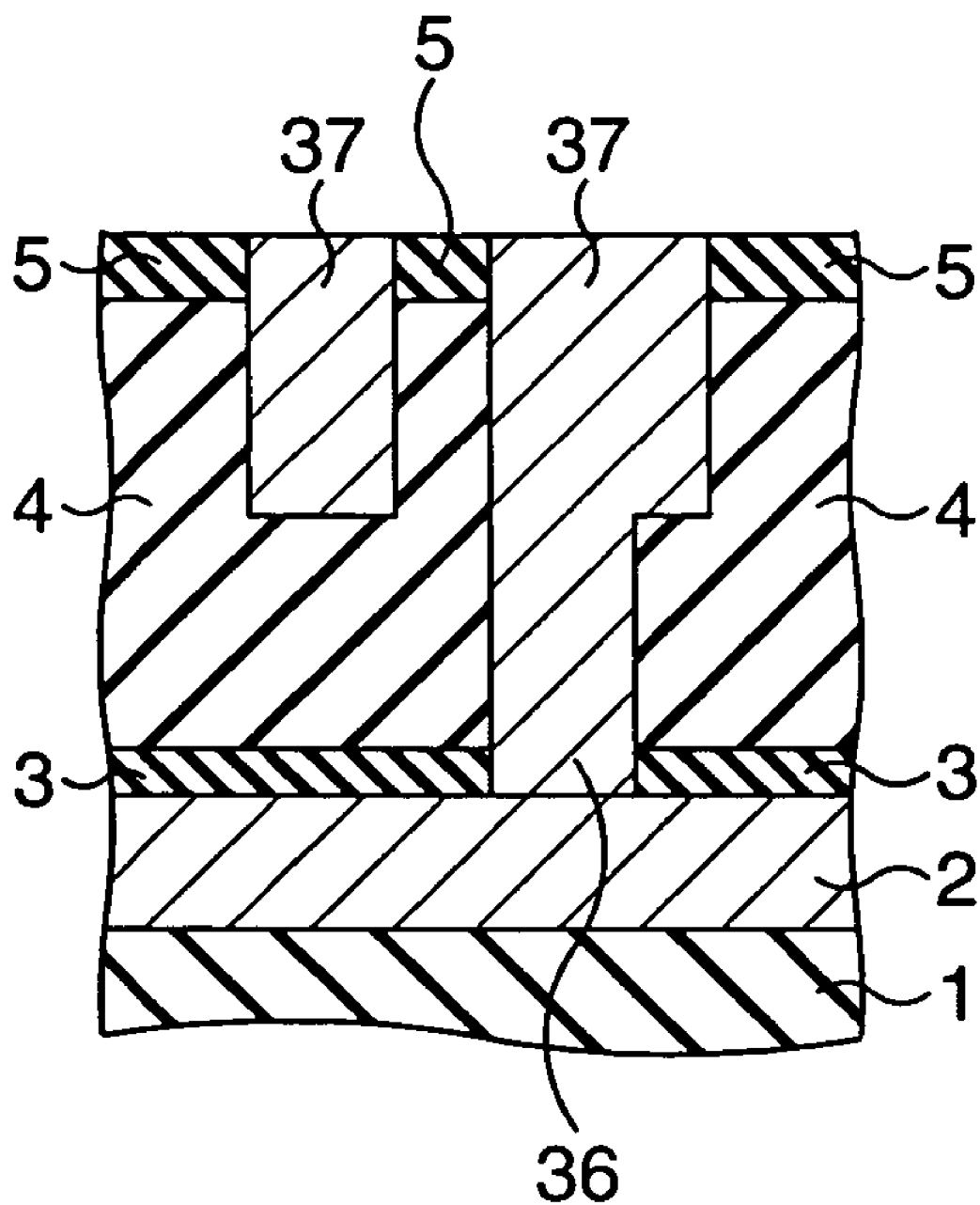

A barrier metal film and Cu seed film (neither is shown) are formed on the bottom portions and side portions of the wiring trenches 34 and via hole 35. After that, as shown in FIG. 6P, a Cu film (wiring material) 11 is buried in the wiring trenches 34 and via hole 35 by plating. Then, as shown in FIG. 6Q, the Cu film 11 is polished by CMP (Chemical Mechanical Polishing) until the SiC film 5 is exposed, thereby forming a contact via 36 and Cu interconnections 37. Furthermore, interlayer dielectric films, upper interconnections, and the like are formed to complete a semiconductor device.

Figure 7:
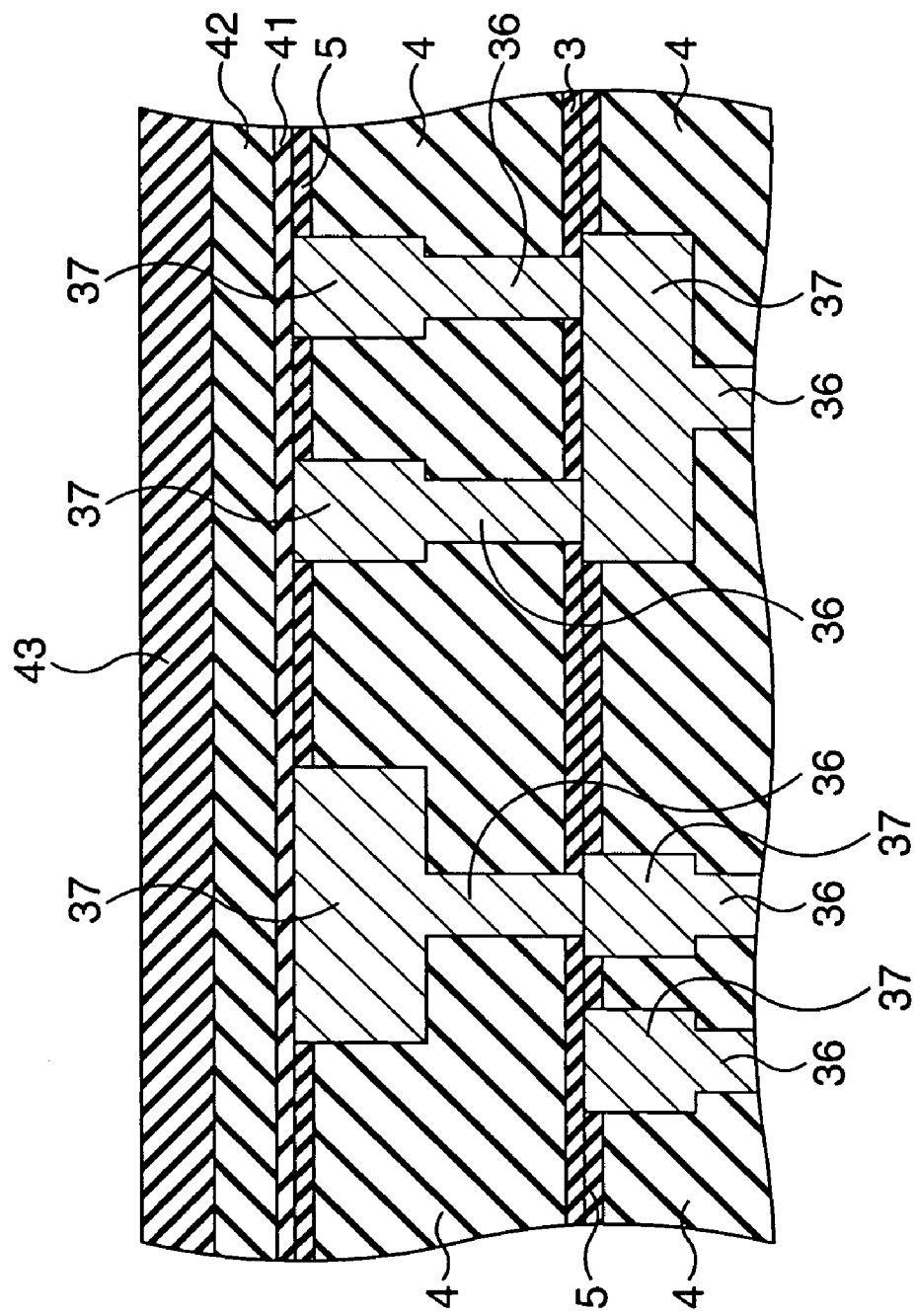
FIG. 7 is a sectional view showing the structure of a semiconductor device fabricated by applying the third embodiment of the present invention.

FIG. 7 is a sectional view showing the structure of a semiconductor device fabricated by applying the third embodiment. In this example shown in FIG. 7, a multilayered interconnection having at least two layers is formed by the fabrication method according to the third embodiment. A passivation film 41 made of, e.g., SiN is formed on Cu interconnections 37 and a porous silica film 4 in the uppermost layer. On the passivation film 41, a cover film made up of a silicon oxide film 42 and SiN film 43 is formed. Holes (not shown) for extracting pads are appropriately formed in this cover film.

As described above, even when the present invention is applied to the dual damascene method, it is possible to prevent deformation of the porous silica film 4, and obtain the designed structure and characteristics. In the third embodiment, the dual damascene method is applied to the second embodiment. However, this dual damascene method may also be applied to the first embodiment.

The material of the interlayer dielectric film is not particularly limited as long as the material contains Si, C, and O. That is, it is also possible to use another low-dielectric-constant film such as an SiOC film, SiOCN film, porous SiOC film, or porous SiOCN film, instead of the porous silica film.

In the plasma processing for forming a modified layer or polymer deposition film, not only hydrogen plasma but also a plasma of a reducing gas containing hydrogen (element), e.g., ammonium plasma, may also be used. Alternatively, helium plasma can be used to give impact to the side surfaces of the interlayer dielectric film such as a porous silica film, thereby hardening the side surfaces.

Patent reference 1 (Japanese Patent Application Laid-Open No. 2003-124189) describes a method in which after a porous film is etched by using a resist mask as a mask, ashing is performed by $O_2$/CO plasma, and an SiC film as a barrier film is etched. In this method, however, the porous film is damaged by the ashing process using the plasma. In contrast, the present invention can avoid this damage because the organic film such as a resist is removed before a hole is formed in the interlayer dielectric film, so the degree of the plasma processing can be properly controlled.

Patent reference 2 (Japanese Patent No. 3250518) describes a method in which when an organic low-dielectric-constant film is to be processed, a side-wall deposition product is formed on the side surfaces of the low-dielectric-constant film by using $NH_3$ or a gas system obtained by adding $N_2$ to $H_2$, thereby preventing bowing of the pattern. In this method, however, the side-wall deposition product is removed by wet processing before a trench is allowed to reach a lower interconnection, so the low-dielectric-constant film cannot be protected when the trench is allowed to reach the lower interconnection. However, the necessity of protection is low since an organic film is used as the low-dielectric constant film and the selectivity when an SiC film is etched is high.

Patent reference 3 (Japanese Patent No. 3365554) describes a method in which in order to prevent the side surfaces of a porous film from becoming unstable after etching, an insulating film is formed on the surface by $O_2$ plasma processing, the surface is nitrided by plasma processing using $NH_3$, $N_2$, or $N_2O$, and a dielectric undercoating is processed after that. However, when the side surfaces of the porous film are nitrided, the selectivity to the dielectric undercoating lowers, and this allows easy occurrence of side etching.

Patent reference 4 (Japanese Patent Application Laid-Open No. 2002-26121) describes a method by which $O_2$ plasma processing is performed for a low-density, low-dielectric-constant film. However, when this $O_2$ plasma processing is performed by using a general RIE (Reactive Ion Etching) apparatus, side etching occurs to cause the side surfaces of the low-density, low-dielectric-constant film to recede in some cases. In contrast, no such recession takes place when a plasma containing hydrogen but not containing oxygen is used as in the present invention.

In the first semiconductor device fabrication method, the selectivity to the SiC barrier film can be increased by modifying the side surfaces of the interlayer dielectric film by the plasma processing. Therefore, the interlayer dielectric film is not side-etched even when the SiC barrier film is etched after that. As a consequence, desired characteristics (designed characteristics) can be obtained.

In the second semiconductor device fabrication method, the organic film formed by the plasma processing functions as a protective film of the interlayer dielectric film. Therefore, the interlayer dielectric film is not side-etched even when the SiC barrier film is etched after that, so desired characteristics (designed characteristics) can be obtained.

What is claimed is:
1. A method of fabricating a semiconductor device, comprising the steps of:
   forming an SiC barrier film over an interconnection;

forming an interlayer dielectric film containing Si, C, and O over the SiC barrier film, wherein the interlayer dielectric film is a low dielectric constant film;

forming wiring trench and a via hole reaching the SiC barrier film in the interlayer dielectric film;

performing plasma processing using a hydrogen-containing gas on side surfaces of the interlayer dielectric film, the side surfaces being exposed to the wiring trench and the via hole with the interconnection being covered with the SiC barrier film;

etching the SiC barrier film to allow the via hole to reach the interconnection, after the plasma processing; and burying a conductive material in the hole, wherein a dual damascene method is used.

2. The method according to claim 1, wherein a gas containing at least $H_2$ gas is used as the hydrogen-containing gas.

3. The method according to claim 1, wherein a gas containing at least $NH_3$ gas is used as the hydrogen-containing gas.

4. The method according to claim 1, wherein the side surfaces of the interlayer dielectric film is modified by the plasma processing, thereby increasing a selectivity to the SiC barrier film.

5. The method according to claim 4, wherein a thickness of the side surfaces to be modified by the plasma processing is not more than 10 nm.

6. The method according to claim 1, wherein the plasma processing is performed by supplying a gas containing $N_2$ gas and not substantially containing oxygen into a processing chamber in addition to the hydrogen-containing gas.

7. The method according to claim 1, wherein a film selected from the group consisting of a porous silica film, SiOC film, porous SiOC film, SiOCN film, and porous SiOCN film is formed as the interlayer dielectric film.

8. The method according to claim 1, wherein a single damascene method is used, and the hole is formed as a wiring trench.

9. A method of fabricating a semiconductor device, comprising the steps of:

forming an SiC barrier film over an interconnection;

forming an interlayer dielectric film containing Si, C, and O over the SiC barrier film, wherein the interlayer dielectric film is a low dielectric constant film;

forming a wiring trench and a via hole reaching the SiC barrier film in the interlayer dielectric film;

performing plasma processing on side surfaces of the interlayer dielectric film, the side surfaces being exposed to the wiring trench and a via hole, thereby forming an organic film on the side surfaces of the interlayer dielectric film with the interconnection being covered with the Sic barrier film;

etching the Sic barrier film to allow the via hole to reach the interconnection, after the plasma processing; and burying a conductive material in the hole, wherein a dual damascene method is used.

10. The method according to claim 9, wherein the plasma processing is performed by supplying a gas containing carbon and fluorine into a processing chamber.

11. The method according to claim 9, further comprising the step of forming an $SiO_2$ film on the interlayer dielectric film, between the step of forming the interlayer dielectric film and the step of forming the hole in the interlayer dielectric film, wherein the hole is also formed in the $SiO_2$ film in the step of forming the hole in the interlayer dielectric film, and the plasma processing is performed such that no organic film is formed over the $SiO_2$ film.

12. The method according to claim 9, wherein $C_4F_6$ gas is used in the step of performing the plasma processing and in the step of etching the SiC barrier film.

13. The method according to claim 9, wherein a film selected from the group consisting of a porous silica film, SiOC film, porous SiOC film, SiOCN film, and porous SiOCN film is formed as the interlayer dielectric film.

14. The method according to claim 9, wherein a single damascene method is used, and the hole is formed as a wiring trench.

15. A method of fabricating a semiconductor device, comprising the steps of:

forming an SiC barrier film over an interconnection;

forming an interlayer dielectric film containing Si, C, and O over the SiC barrier film, wherein the interlayer dielectric film is a low dielectric constant film;

forming a wiring trench and a via hole reaching the SiC barrier film in the interlayer dielectric film;

performing plasma processing on side surfaces of the interlayer dielectric film, the side surfaces being exposed to the wiring trench and a via hole, thereby giving impact to the side surfaces of the interlayer dielectric film to harden the side surfaces with the interconnection being covered with the Sic barrier film;

etching the SiC barrier film to allow the via hole to reach the interconnection, after the plasma processing; and burying a conductive material in the hole, wherein a dual damascene method is used.

16. The method according to claim 15, wherein the plasma processing is performed by supplying a gas containing at least He gas into a processing chamber.

17. The method according to claim 15, wherein a film selected from the group consisting of a porous silica film, SiOC film, porous SiOC film, SiOCN film, and porous SiOCN film is formed as the interlayer dielectric film.

18. The method according to claim 15, wherein a single damascene method is used, and the hole is formed as a wiring trench.

* * * * *